US010217906B2

(12) United States Patent
Chen et al.

(10) Patent No.: US 10,217,906 B2
(45) Date of Patent: Feb. 26, 2019

(54) LIGHT-EMITTING DEVICE

(71) Applicant: EPISTAR CORPORATION, Hsinchu (TW)

(72) Inventors: Chao-Hsing Chen, Hsinchu (TW); Jia-Kuen Wang, Hsinchu (TW); Tzu-Yao Tseng, Hsinchu (TW); Wen-Hung Chuang, Hsinchu (TW); Cheng-Lin Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/880,067

(22) Filed: Jan. 25, 2018

(65) Prior Publication Data

US 2018/0212125 A1    Jul. 26, 2018

Related U.S. Application Data

(60) Provisional application No. 62/450,860, filed on Jan. 26, 2017.

(51) Int. Cl.

| H01L 33/62 | (2010.01) |
| H01L 33/40 | (2010.01) |
| H01L 33/22 | (2010.01) |
| H01L 33/46 | (2010.01) |
| H01L 33/42 | (2010.01) |
| H01L 33/00 | (2010.01) |

(Continued)

(52) U.S. Cl.
CPC ............ *H01L 33/405* (2013.01); *H01L 33/22* (2013.01); *H01L 33/42* (2013.01); *H01L 33/46* (2013.01); *H01L 33/62* (2013.01); *F21K 9/23* (2016.08); *F21K 9/232* (2016.08); *F21K 9/69* (2016.08); *F21Y 2115/10* (2016.08); *H01L 33/0075* (2013.01); *H01L 33/06* (2013.01); *H01L 33/12* (2013.01); *H01L 33/32* (2013.01); *H01L 2933/0016* (2013.01); *H01L 2933/0025* (2013.01)

(58) Field of Classification Search
CPC ......... H01L 33/62; H01L 33/46; H01L 33/06; H01L 33/32; H01L 33/12; F21K 9/23
See application file for complete search history.

(56) References Cited

U.S. PATENT DOCUMENTS

| 2016/0013388 A1* | 1/2016 | Lee ..................... H01L 27/156 257/13 |
| 2017/0108173 A1* | 4/2017 | Kim ..................... F21K 9/232 |
| 2017/0141260 A1* | 5/2017 | Chen ..................... H01L 33/46 |

* cited by examiner

*Primary Examiner* — Yosef Gebreyesus (74) *Attorney, Agent, or Firm* — Muncy, Geissler, Olds & Lowe, P.C.

(57) ABSTRACT

A light-emitting device includes a semiconductor structure including a first semiconductor layer, a second semiconductor layer, and an active layer formed between the first semiconductor layer and the second semiconductor layer; a surrounding part surrounding the semiconductor structure and exposing a surface of the first semiconductor layer; a first insulating structure formed on the semiconductor structure, including a plurality of protrusions covering the surface of the first semiconductor layer and a plurality of recesses exposing the surface of the first semiconductor layer; a first contact portion formed on the surrounding part and contacting the surface of the first semiconductor layer by the plurality of recesses; a first pad formed on the semiconductor structure; and a second pad formed on the semiconductor structure.

20 Claims, 8 Drawing Sheets

(51) Int. Cl.
*H01L 33/32* (2010.01)
*F21K 9/23* (2016.01)
*H01L 33/06* (2010.01)
*H01L 33/12* (2010.01)
*F21K 9/232* (2016.01)
*F21Y 115/10* (2016.01)
*F21K 9/69* (2016.01)

| maximum applied voltage $V_{a(max)}$ | Forward voltage Vf(V) | | | |
|---|---|---|---|---|
| | light-emitting device 2 | | conventional light-emitting device 3 | |
| | sample1 | sample2 | sample1 | sample2 |
| 0 | 2.234 | 2.319 | 2.362 | 2.367 |
| 20 | 2.237 | 2.324 | 2.369 | 2.37 |
| 30 | 2.235 | 2.322 | 2.368 | 2.376 |
| 35 | 2.237 | 2.32 | 2.366 | 2.372 |
| 40 | 2.238 | 2.323 | 2.365 | 2.372 |
| 45 | 2.245 | 2.324 | 2.364 | 2.372 |
| 50 | 2.234 | 2.322 | <2.15 | <2.15 |
| 55 | 2.236 | 2.328 | | |
| 60 | 2.289 | <2.15 | | |
| 65 | <2.15 | | | |

FIG. 8

| maximum applied voltage $V_{a(max)}$ | reverse current Ir (μA) | | | | | | | |
|---|---|---|---|---|---|---|---|---|
| | light-emitting devic 2 | | | | conventional light-emitting device 3 | | | |
| | sample1 | sample2 | sample3 | sample4 | sample1 | sample2 | sample3 | sample4 |
| 0 | 0 | 0 | 0 | 0 | 0 | 0 | 0 | 0 |
| 60 | 0 | 0 | 0 | 0 | 0 | 0 | 0 | 0 |
| 65 | 0 | 0 | 0 | 0 | 0 | 0 | 100 | 100 |
| 70 | 0 | 0 | 0 | 0 | 100 | 100 | 100 | 100 |
| 75 | 100 | 100 | 100 | 100 | 100 | 100 | 100 | 100 |
| 80 | 100 | 100 | 100 | 100 | 100 | 100 | 100 | 100 |

LIGHT-EMITTING DEVICE

CROSS REFERENCE TO RELATED APPLICATIONS

This application claims priority of U.S. Provisional Application No. 62/450,860 filed on Jan. 26, 2017 under 35 U.S.C. § 119(e), the entire contents of all of which are hereby incorporated by reference.

TECHNICAL FIELD

The application relates to a structure of a light-emitting device, and more particularly, to a light-emitting device including a semiconductor structure and a pad on the semiconductor structure.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device includes a semiconductor structure including a first semiconductor layer, a second semiconductor layer, and an active layer formed between the first semiconductor layer and the second semiconductor layer; a surrounding part surrounding the semiconductor structure and exposing a surface of the first semiconductor layer; a first insulating structure formed on the semiconductor structure, including a plurality of protrusions covering portions of the surface of the first semiconductor layer and a plurality of recesses exposing other portions the surface of the first semiconductor layer; a first contact portion formed on the surrounding part and contacting the other portions of the surface of the first semiconductor layer by the plurality of recesses; a first pad formed on the semiconductor structure; and a second pad formed on the semiconductor structure.

A light-emitting device includes a semiconductor structure comprising a first semiconductor layer, a second semiconductor layer, and an active layer between the first semiconductor layer and the second semiconductor layer; a surrounding part surrounding the semiconductor structure and exposing a surface of the first semiconductor layer; a first insulating structure formed on the semiconductor structure, covering corners of the surface of the first semiconductor layer and exposing portions at edges of the surface of the first semiconductor layer; a first contact portion formed on the surrounding part and contacting the portions at edges of the surface of the first semiconductor layer; a first pad formed on the semiconductor structure; and a second pad formed on the semiconductor structure.

DETAILED DESCRIPTION OF PREFERRED EMBODIMENTS

The embodiment of the application is illustrated in detail, and is plotted in the drawings. The same or the similar part is illustrated in the drawings and the specification with the same number.

Figure 1:
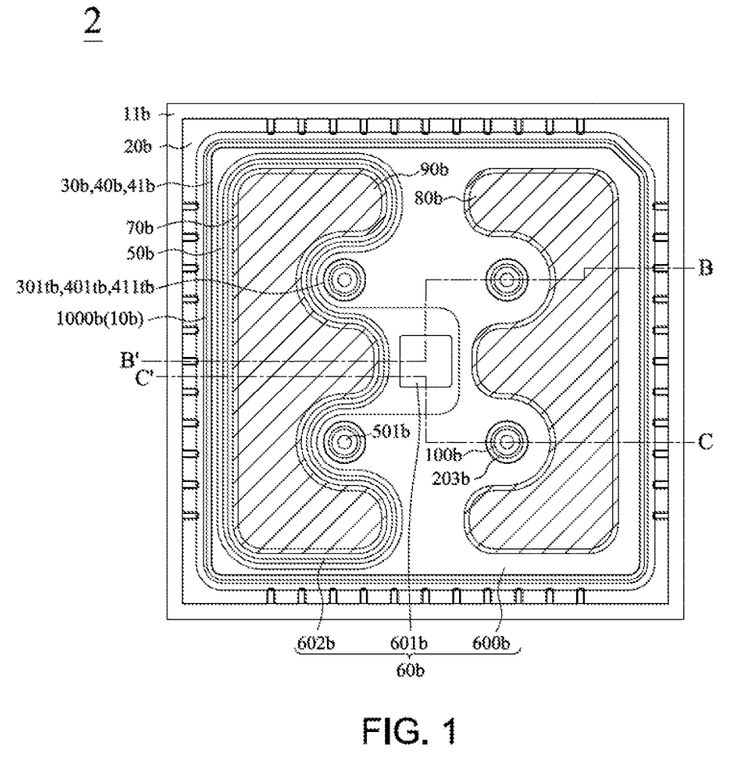
FIG. 1 illustrates a top view of a light-emitting device 2 in accordance with an embodiment of the present application.
Figure 2:
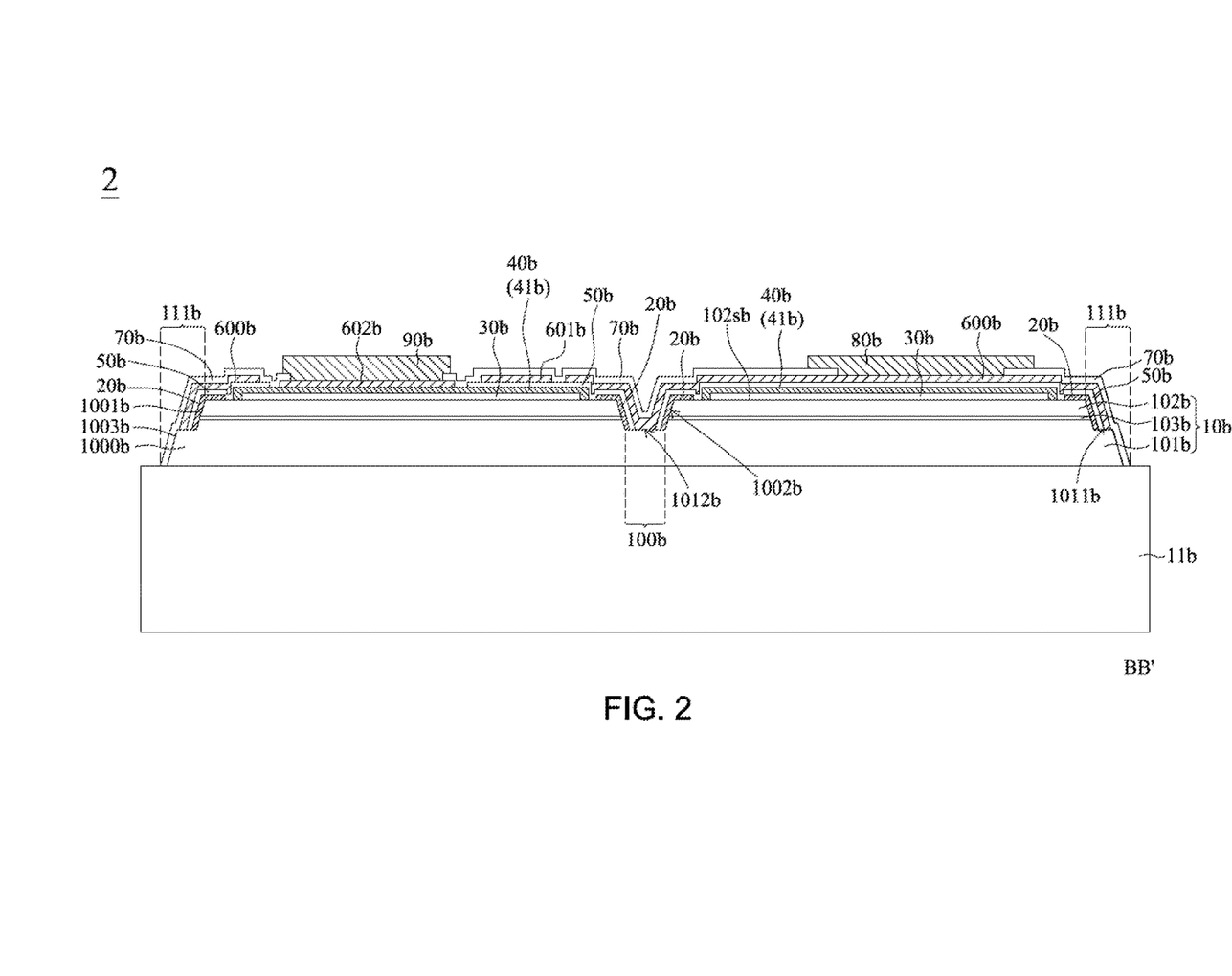
FIG. 2 illustrates a cross-sectional view taken along line B-B' of FIG. 1.
Figure 3:
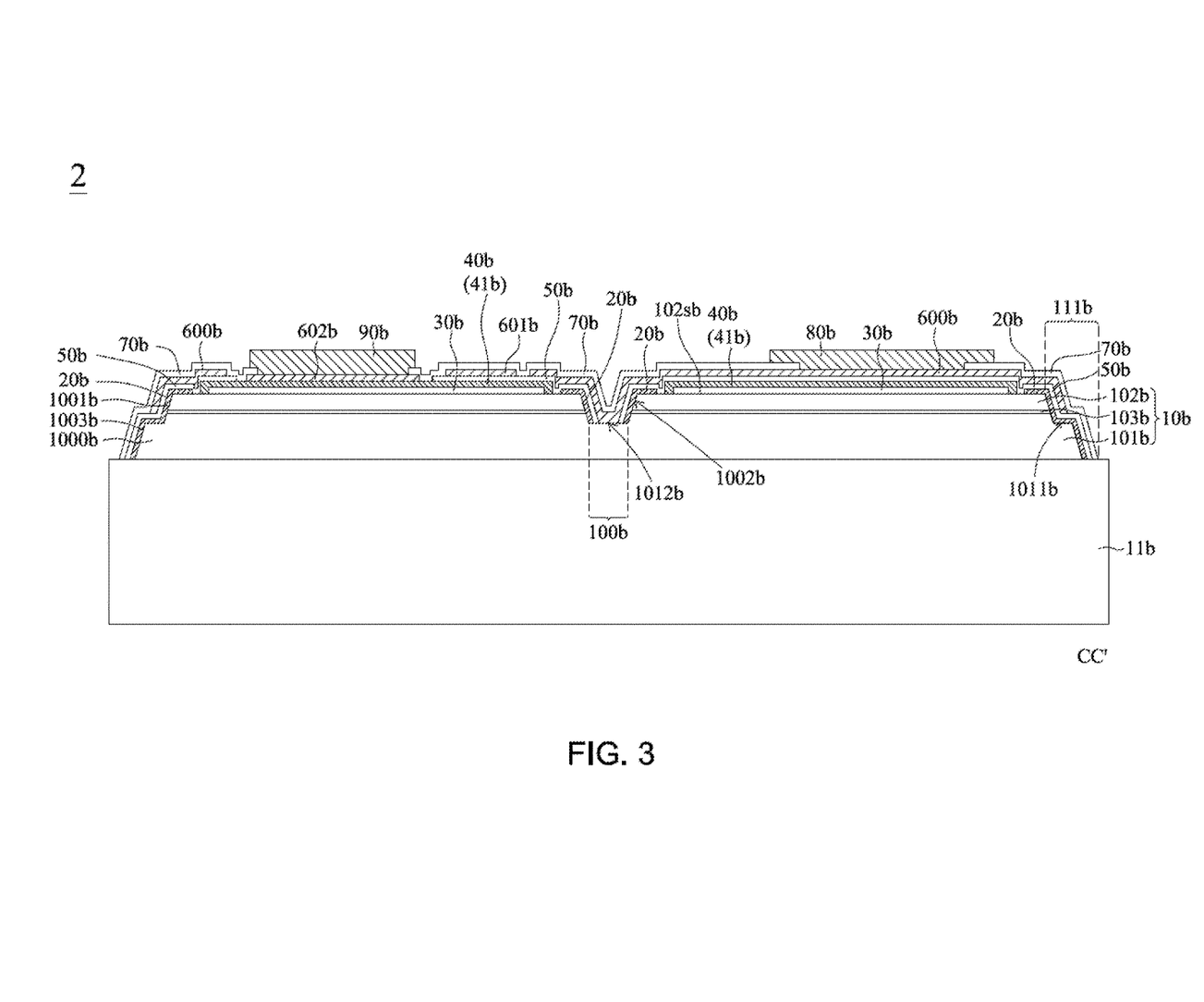
FIG. 3 illustrates a cross-sectional view taken along line C-C' of FIG. 1.
Figure 4:
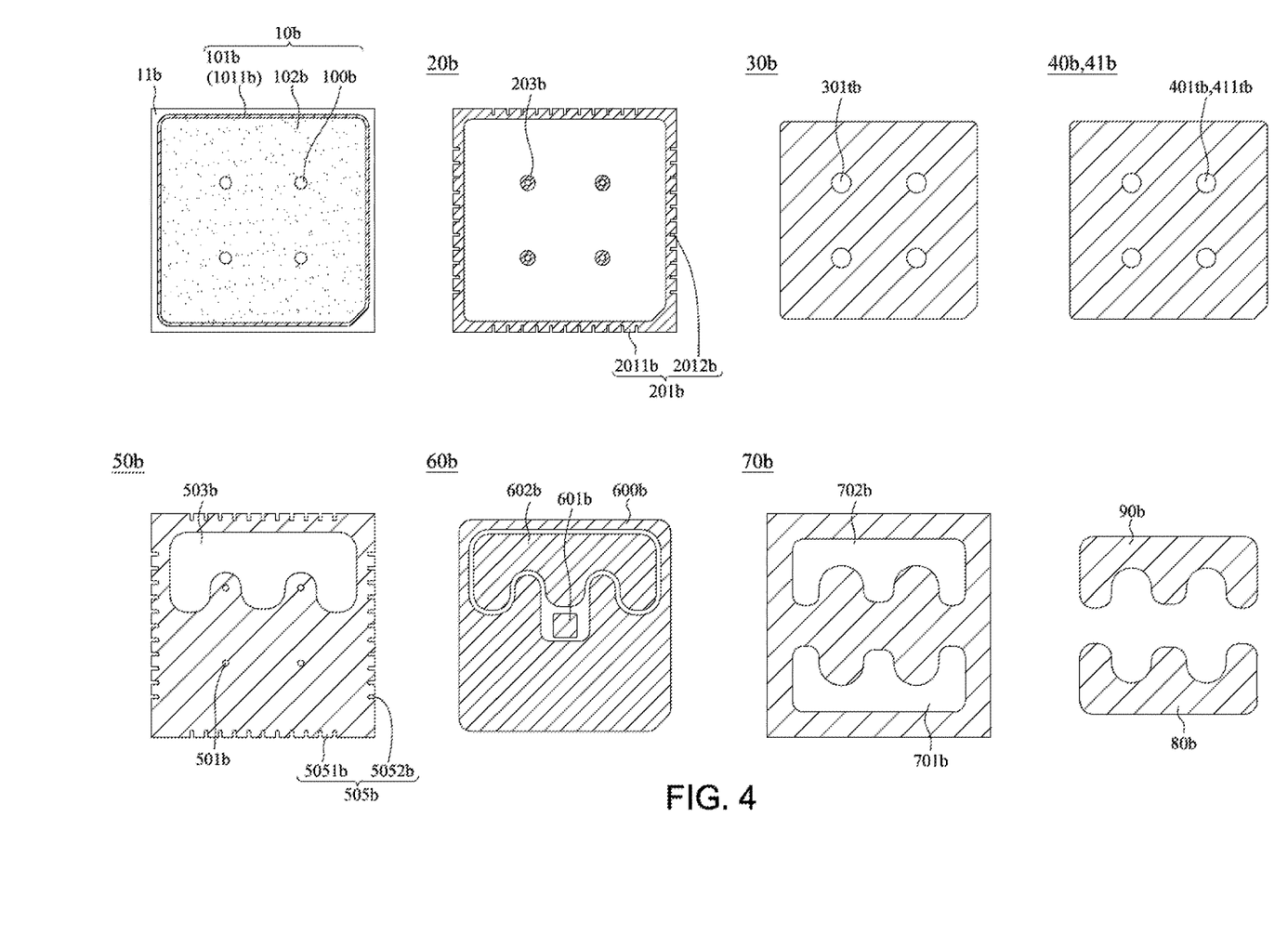
FIG. 4 illustrates a process flow of the light-emitting device 2 shown in FIG. 1.

Referring to FIG. 1 to FIG. 4, FIG. 1 is a top view of a light-emitting device 2 in accordance with an embodiment of the present application, FIG. 2 is a cross-sectional view taken along line B-B' of FIG. 1, FIG. 3 is a cross-sectional view taken along line C-C' of FIG. 1, and FIG. 4 shows a process flow of the light-emitting device 2 shown in FIG. 1.

The light-emitting device 2 includes a substrate 11b; one or more semiconductor structure 1000b on the substrate 11b; a surrounding part 111b surrounding the one or more semiconductor structure 1000b; a first insulating structure 20b disposed on the semiconductor structure 1000b and formed along the surround part 111b; a transparent conductive layer 30b disposed on the one or more semiconductor structure 1000b; a reflective structure including a reflective layer 40b and a barrier layer 41b disposed on the transparent conductive layer 30b; a second insulating structure 50b covers the reflective layer 40b and the barrier layer 41b; a contact layer 60b disposed on the second insulating structure 50b; a third insulating structure 70b disposed on the contact layer 60b; and a first pad 80b and a second pad 90b disposed on the contact layer 60b.

Referring to FIGS. 1-4, the manufacturing process of the light-emitting device 2 includes, initially, forming the semiconductor stack 10b on the substrate 11b. The substrate 11b can be a sapphire substrate, but is not limited thereto. In one embodiment, the substrate 11b includes a patterned surface. The patterned surface includes a plurality of patterns. The shape of the pattern includes cone, pyramid or hemisphere.

In an embodiment of the present application, the substrate 11b can be a growth substrate for epitaxialy growth the semiconductor stack 10b, including gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing indium gallium nitride (InGaN).

In an embodiment of the present application, the substrate 11b includes a patterned surface between the semiconductor structures 1000b and the substrate 11b which can enhance the light extraction efficiency of the light-emitting device 2. The exposed surface of the substrate 11b also includes a patterned surface (not shown). Various configurations of pattern can be adopted, including random pattern, microlenses, microarrays, scattering regions or other optical regions. For example, the patterned surface includes a plurality of protrusions, and each protrusion may be about 0.5~2.5 μm in height, 1~3.5 μm in width, and about 1~3.5 μm in pitch.

In an embodiment of the present application, the substrate 11b includes a sidewall. The sidewall includes a flat surface and/or a rough surface to enhance the light-extraction efficiency of the light-emitting device 2. In an embodiment of the present application, the sidewall of the substrate 11b can be inclined to a surface of the substrate 11b adjoined to the semiconductor structure 1000b to adjust the optical field distribution of the light-emitting device 2.

In an embodiment of the present application, the semiconductor stack 10b includes optical characteristics, such as light-emitting angle or wavelength distribution, and electrical characteristics, such as forward voltage or reverse current. The semiconductor stack 10b can be formed on the substrate 11b by organic metal chemical vapor deposition (MOCVD), molecular beam epitaxy (MBE), hydride vapor deposition (HVPE), or ion plating, such as sputtering or evaporation.

Each of the one or more semiconductor structures 1000b includes the semiconductor stack 10b including a first semiconductor layer 101b, a second semiconductor layer 102b, and an active layer 103b between the first semiconductor layer 101b and the second semiconductor layer 102b. Moreover, the semiconductor structure 1000b further includes one or a plurality of vias 100b penetrating the second semiconductor layer 102b and the active layer 103b to expose the first semiconductor layer 101b. Each of the first semiconductor layer 101b and the second semiconductor layer 102b can be composed of a single layer or multiple sub-layers. Further, the active layer 103b can have a single-quantum well structure or a multi-quantum well structure. The semiconductor stack 10b can be formed by growing a group III nitride based compound semiconductor layer on the substrate 11b, and the growing method includes metal organic chemical vapor deposition (MOCVD), molecular beam epitaxy (MBE) or physical vapor deposition (PVD).

Moreover, a buffer structure (not shown) can be formed on the substrate 11b before forming the semiconductor stack 10b, so as to relieve lattice mismatch between the substrate 11b and the semiconductor stack 10b. The buffer structure can be made from GaN-based material, such as gallium nitride and aluminum gallium nitride, or an AlN-based material. The buffer structure can be a single layer or multiple layers. The buffer structure can be formed by metal organic chemical vapor deposition (MOCVD), molecular beam epitaxy (MBE) or physical vapor deposition (PVD). The PVD method includes sputtering, for example, reactive sputtering, or evaporation, such as e-beam evaporation or thermal evaporation. In one embodiment, the buffer structure includes an AlN buffer layer and is formed by sputtering. The AlN buffer layer is formed on a growth substrate with a patterned surface. The sputtering method can produce a dense buffer layer with high uniformity, and therefore the AlN buffer layer can conformably deposit on the patterned surface of the substrate 11b.

In an embodiment of the present application, the first semiconductor layer 101b and the second semiconductor layer 102b, such as a cladding layer, have different conductivity types, electrical properties, polarities, or doping elements for providing electrons or holes. For example, the first semiconductor layer 101b is an n-type semiconductor and the second semiconductor layer 102b is a p-type semiconductor. The active layer 103b is formed between the first semiconductor layer 101b and the second semiconductor layer 102b. The electrons and holes combine in the active layer 103b under a current driving to convert electric energy into light energy and then light is emitted from the active layer 103b. The wavelength of the light emitted from the light-emitting device 2 is adjusted by changing the physical and chemical composition of one or more layers in the semiconductor stack 10b. The material of the semiconductor stack 10b includes a group III-V semiconductor material, such as $Al_xIn_yGa_{(1-x-y)}N$ or $Al_xIn_yGa_{(1-x-y)}P$, wherein $0 \le x, y \le 1$; $(x+y) \le 1$. According to the material of the active layer 103b, when the material of the semiconductor stack 10b is AlInGaP series material, red light having a wavelength between 610 nm and 650 nm or yellow light having a wavelength between 550 nm and 570 nm can be emitted. When the material of the semiconductor stack 10b is InGaN series material, blue or deep blue light having a wavelength between 400 nm and 490 nm or green light having a wavelength between 490 nm and 550 nm can be emitted. When the material of the semiconductor stack 10b is AlGaN series material, UV light having a wavelength between 400 nm and 250 nm can be emitted. The active layer 103b can be a single heterostructure (SH), a double heterostructure (DH), a double-side double heterostructure (DDH), or a multi-quantum well structure, MQW). The material of the active layer 103b can be i-type, p-type, or n-type semiconductor.

After forming the semiconductor stack 10b on the substrate 11b, the semiconductor stack 10b is patterned by photolithography and etching process to form the plurality of vias 100b and the surrounding part 111b. By such photolithography and etching process, parts of inner portions of the second semiconductor layer 102b and the active layer 103b are removed to form the plurality of vias 100b, and a second surface 1012b of the first semiconductor layer 101b is exposed by the vias 100b accordingly. Herein, the via 100b is defined by an inside wall 1002b and the second surface 1012b. One end of the inside wall 1002b is connected to the second surface 1012b of the first semiconductor layer 101b and another end of the inside wall 1002b is connected to a surface 102sb of the second semiconductor layer 102b.

By the same or another photolithography and etching process, peripheries of the second semiconductor layer 102b and the active layer 103b around the semiconductor structure 1000b are removed to form the surrounding part 111b, and a first surface 1011b of the first semiconductor layer 101b is exposed by the surrounding part 111b accordingly. In another embodiment, in the photolithography and etching process, parts of the first semiconductor layer 101b can be further removed to a deeper etching depth to expose the second surface 1012b and the first surface 1011b. Specifically, the surrounding part 111b includes the exposed surface of the substrate 11b, an exposed surface including the first surface 1011b of the first semiconductor layer 101b, and a first outside wall 1003b and a second outside wall 1001b composed by exposed side surfaces of the second semiconductor layer 102b, active layer 103b and the first semiconductor layer 101b, wherein one end of the first surface 1011b is connected to the first outside wall 1003b and another end of the first surface 1011b is connected to the second outside wall 1001b. The first outside wall 1003b and the second outside wall 1001b are inclined to the first surface 1011b. The surrounding part 111b is disposed along a periphery of the semiconductor structure 1000b, and the surrounding part 111b is disposed at and/or surrounds the periphery of the one or more semiconductor structure 1000b. In one embodiment, the first outside wall 1003b inclines to the exposed surface (not shown) of the substrate 11b. An angle between the first outside wall 1003b and the exposed surface of the substrate 11b includes an acute angle. In one embodiment, an angle between the first outside wall 1003b and the exposed surface of the substrate 11b includes an obtuse angle.

After the semiconductor structure 1000b is formed, the first insulating structure 20b is formed on the semiconductor structure 1000b, covers a part of the surface 102sb of the second semiconductor layer 102b, and extends to the second outside wall 1001b, and further covers the first surface 1011b. In other words, the first insulating structure 20b covers portions of the surrounding part 111b. The first insulating structure 20b protects the sidewall of the semiconductor structure 1000b to prevent the active layer 103b from being destroyed by the following processes. As shown in FIG. 4, the first insulating structure 20b includes a surrounding insulating part 201b and a plurality of ring-shaped caps 203b in a top view. Herein, the surrounding insulating part 201b including a plurality of protrusions 2011b and a plurality of recesses 2012b in a top view. The plurality of ring-shaped caps 203b is surrounded by the surrounding insulating part 201b, and each of the plurality of ring-shaped caps 203b is formed in the plurality of vias 100b. A position of the plurality of ring-shaped caps 203b corresponds to a position of the plurality of vias 100b. Each of the plurality of ring-shaped caps 203b has an opening (not be labelled) to expose the second surface 1012b of the first semiconductor layer 101b. In one embodiment, the surrounding insulating part 201b of the first insulating structure 20b is disposed along the first surface 1011b of the first semiconductor layer 101b and surrounds the semiconductor structure 1000b. In the embodiment, the plurality of protrusions 2011b and the plurality of recesses 2012b of the surrounding insulating part 201b are alternately arranged along the surrounding part 111b, and positions of the plurality of ring-shaped caps 203b correspond to those of the plurality of vias 100b of the semiconductor structure 1000b, but the present application is not limited hereto. In one embodiment, the space between two protrusions 2011b composes the recesses 2012b. In another embodiment, the surrounding insulating part 201b can further includes a sub-protrusion protruding from the protrusion 2011b, and/or can further includes a sub-recess indenting from the recess 2012b. In the embodiment, the plurality of protrusions 2011b extends from the surface 102sb of the second semiconductor layer 102b, and directly contacts and covers portions of the first surface 1011b of the first semiconductor layer 101b and corners of the first surface 1011b of the first semiconductor layer 101b. The plurality of recesses 2012b exposes other portions of the first surface 1011b of the first semiconductor layer 101b not covered by the plurality of protrusions 2011b. In one embodiment, the plurality of recesses 2012b exposes the first surface 1011b at edges of the semiconductor structure 1000b. As shown in FIG. 2, in the cross-sectional view, a portion of the first surface 1011b of the first semiconductor layer 101b is exposed by the recess 2012b of the first insulating structure 20b. As shown in FIG. 3, in the cross-sectional view, the protrusion 2011b of the first insulating structure 20b covers the first surface 1011b of the first semiconductor layer 101b and sidewalls of the semiconductor structure 1000b. In other words, the plurality of protrusions 2011b and the plurality of recesses 2012b are arranged alternately to cover portions of the first surface 1011b of the first semiconductor layer 101b and expose other portions of the first surface 1011b of the first semiconductor layer 101b respectively. In this embodiment, the exposed portions of the first surface 1011b are discontinuous and a total area of the exposed portions of the first surface 1011b is smaller than an entire area of the first surface 1011b. Most of the second semiconductor layer 102b is not covered by the first insulating structure 20b. In one embodiment, from a top view, a shape of the surrounding insulating part 201b can include a ring-like shape, for example, a rectangular ring, a circle ring, or a polygonal ring. A shape of one of the plurality of protrusions 2011b or the plurality of recesses 2012b can include a triangle, a rectangle, a semicircle, a circle, or a polygon from a top view. A material of the first insulating structure 20b can be a non-conductive material. Herein the non-conductive material includes organic material, inorganic material or dielectric material. The organic material includes Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium dioxide ($TiO_2$), or magnesium fluoride ($MgF_x$). The first insulating structure 20b includes a single layer or multiple layers. The first insulating structure 20b protects the sidewall of the semiconductor structure 1000b to prevent the active layer 103b from being destroyed by the following processes. When the first insulating structure 20b includes multiple layers, the first insulating structure 20b can be a distributed Bragg reflector (DBR) which includes a plurality pairs of layers, and each layer has a refractive index different from that of adjacent layers. Specifically, the first insulating structure 20b can be formed by alternately stacking a $SiO_x$ layer and a $TiO_x$ layer. The DBR can protect the sidewalls of the semiconductor structure 1000b and provide a high reflectivity for particular wavelength or within a particular wavelength range by setting the refractive index difference between each pair of the layers with a high refractive index and a low refractive index respectively. The thicknesses of two layers in each pair can be different. The thicknesses of the layers in each pair with the same material can be the same or different. The DBR can selectively reflect light of a specific wavelength emitted from the active layer 103b to outside of the light-emitting device 2 to enhance brightness.

After forming the first insulating structure 20b, the transparent conductive layer 30b is formed on the second semiconductor layer 102b and includes a plurality of openings 301tb to expose the second surface 1012b of the first semiconductor layer 101b. In the embodiment, in a top view, a shape of the transparent conductive layer 30b corresponds to a shape of the second semiconductor layer 102b, and positions of the plurality of openings 301tb correspond to that of the plurality of ring-shaped caps 203b and vias 100b. The transparent conductive layer 30b contacts and covers the second semiconductor layer 102b, spreads current and then injects current to the second semiconductor layer 102b. Additionally, the transparent conductive layer 30b does not contact the first semiconductor layer 101b. In one embodiment, the light-emitting device 2 includes another transparent conductive layer (not shown) contacting the first semiconductor layer 101b of the surrounding part 111b. The material of the transparent conductive layer 30b includes transparent material which is transparent to the light emitted from the active layer 103b, for example, indium zinc oxide (IZO) or indium tin oxide (ITO). The transparent conductive layer 30b can be configured to form a low-resistance contact, for example, ohmic contact, with the second semiconductor layer 102b. The transparent conductive layer 30b includes a single layer or multiple sub-layers. For example, as the transparent conductive layer 30b includes multiple sub-layers, the transparent conductive layer 30b can be a distributed Bragg reflector (DBR) which includes a plurality pairs of sub-layers and each sub-layer has a refractive index different from that of adjacent sub-layers. Specifically, the transparent conductive layer 30b can be formed by alternately stacking two sub-layers made of different materials with different refractive index to be the distributed Bragg reflector (DBR).

After forming the transparent conductive layer 30b, the reflective structure including the reflective layer 40b and the barrier layer 41b is formed on the transparent conductive layer 30b and corresponds to the transparent conductive layer 30b. In one embodiment, the reflective structure is aligned with the transparent conductive layer 30b, and edges of the reflective structure are aligned with that of the transparent conductive layer 30b. In one embodiment, the reflective structure is not aligned with the transparent conductive layer 30b, and the edges of the reflective structure are beyond or behind that of the transparent conductive layer 30b. In one embodiment, the transparent conductive layer 30b and the reflective structure extend onto the first insulating structure 20b.

The reflective layer 40b and the barrier layer 41b include a plurality of openings 401tb and 411tb, respectively. The plurality of openings 401tb of the reflective layer 40b and the plurality of openings 411tb of the barrier layer 41b expose the plurality of ring-shaped caps 203b, vias 100b, and the second surface 1012b of the first semiconductor layer 101b. The barrier layer 41b can be formed on and cover the reflective layer 40b so that the barrier layer 41b can prevent the metal element of the reflective layer 40b from migration, diffusion or oxidation. In one embodiment, a shape of the reflective layer 40b and the barrier layer 41b of the reflective structure corresponds to the shape of the transparent conductive layer 30b. In one embodiment, the shape of the reflective layer 40b and the barrier layer 41b of the reflective structure is similar to a rectangle, and corners of the reflective layer 40b and the barrier layer 41b are curve-like. The reflective layer 40b can include a single layer structure or a multi-layer structure. The material of the reflective layer 40b includes a metal material with a high reflectivity for the light emitted by the active layer 103b, such as silver (Ag), gold (Au), aluminum (Al), titanium (Ti), chromium (Cr), copper (Cu), nickel (Ni), or platinum (Pt) or an alloy thereof. The barrier layer 41b can include a single layer structure or a multi-layer structure. The material of the barrier layer includes chromium (Cr), platinum (Pt), titanium (Ti), tungsten (W), or zinc (Zn). When the barrier layer 41b is the multi-layer structure, the barrier layer 41b is alternately stacked by a first barrier layer (not shown) and a second barrier layer (not shown), for example, Cr/Pt, Cr/Ti, Cr/TiW, Cr/W, Cr/Zn, Ti/Pt, Ti/W, Ti/TiW, Ti/Zn, Pt/TiW, Pt/W, Pt/Zn, TiW/W, TiW/Zn, or W/Zn. In one embodiment, the reflective structure can further include a DBR structure below the reflective layer 40b. The DBR structure includes a plurality pairs of sub-layers, and each sub-layer has a refractive index different from that of adjacent sub-layers. In one embodiment, the sub-layers can be formed by alternately stacking a $SiO_x$ sub-layer and a $TiO_x$ sub-layer. The DBR provides a high reflectivity for particular wavelength or within a particular wavelength range by setting the refractive index difference between each pair of the sub-layers with a high refractive index and a low refractive index respectively. The thicknesses of two sub-layers in each pair can be different. The thicknesses of the sub-layers in each pair with the same material can be the same or different.

After forming the reflective structure, the second insulating structure 50b is formed on the reflective structure to cover parts of top surfaces of the reflective structure (the reflective layer 40b or the barrier layer 41b), and the periphery region of the second semiconductor layer 102b between the reflective structure and the first insulating structure 20b. The second insulating structure 50b also contacts and covers the first insulating structure 20b, so that the first outside wall 1003b and the second outside wall 1001b of the surrounding part 111b and a portion of the first surface 1011b which is covered by the first insulating structure 20b are also covered by the second insulating structure 50b. The second insulating structure 50b protects the sidewall of the semiconductor structure 1000b to prevent the active layer 103b from being destroyed by the following processes. Since the second insulating structure 50b covers the first insulating structure 20b, the second insulating structure 50b is able to prevent the first insulating structure 20b from being etched away in the processes hereafter. As shown in FIG. 4, the second insulating structure 50b includes a plurality of openings 501b and an opening 503b. Herein, the second insulating structure 50b includes a periphery 505b including a plurality of protrusions 5051b and a plurality of recesses 5052b. The opening 503b exposes a portion of the reflective layer 40b or the barrier layer 41b of the reflective structure. The plurality of openings 501b exposes the second surface 1012b of the first semiconductor layer 101b. Referring to FIGS. 2-4, in the embodiment, the periphery 505b of the second insulating structure 50b contacts, covers, and is aligned with that of the first insulating structure 20b. The positions of the plurality of openings 501b correspond to those of the plurality of openings 401tb, 411tb, 301tb, and the plurality of vias 100b. Additionally, the plurality of protrusions 5051b and the plurality of recesses 5052b of the periphery 505b of the second insulating structure 50b are arranged alternately along the surrounding insulating part 201b of the first insulating structure 20b or the surrounding part 111b to cover and expose different portions the first surface 1011b of the first semiconductor layer 101b respectively. In one embodiment, the space between two protrusions 5051b composes the recess 5052b. In another embodiment, the second insulating structure 50b can further includes a sub-protrusion protruding from the protrusion 5051b, and/or can further includes a sub-recess indenting from the recess 5052b. Moreover, in one embodiment, a shape of the periphery 505b of second insulating structure 50b corresponds to that of the first insulating structure 20b for discontinuously exposing portions of the first surface 1011b of the first semiconductor layer 101b at the surrounding part 111b. That is to say, shapes and positions of the plurality of protrusions 5051b and the plurality of recesses 5052b correspond to shapes and positions of the plurality of protrusions 2011b and the plurality of recesses 2012b of the surrounding insulating part 201b. The portions of first surface 1011b exposed by the plurality of recesses 2012b can be also exposed by the plurality of recesses 5052b. The portions of the first surface 1011b covered by the plurality of protrusions 2011b can be covered by the plurality of protrusions 5051b. In the condition of the first surface 1011b being discontinuously exposed by the first insulating structure 20b and the second insulating structure 50b, in one embodiment, the shapes or positions of the plurality of protrusions 5051b and the plurality of recesses 5052b can be different from that of the plurality of protrusions 2011b and the plurality of recesses 2012b. In one embodiment, the areas of the protrusion 5051b and the recess 5052b can be larger or smaller than the areas of the protrusion 2011b and the recess 2012b. The portions of the first surface 1011b exposed by the recesses 2012b and the recesses 5052b can be adjusted by the shapes, positions, and areas of the protrusions 2011b, 5051b and recesses 2012b, 5052b.

As shown in FIG. 2, in the cross-sectional view, a portion of the first surface 1011b of the first semiconductor layer 101b is not only exposed by the plurality of recess 2012b of the first insulating structure 20b, but also exposed by the plurality of recesses 5052b of the second insulating structure 50b. In other words, the plurality of recesses 5052b of the second insulating structure 50b exposes the portions of the first surface 1011b of the first semiconductor layer 101b not covered by the plurality of protrusions 2011b and 5051b and exposed by the plurality of recesses 2012b. As shown in FIG. 3, in the cross-sectional view, the plurality of protrusions 5051b covers the plurality of protrusions 2011b of the first insulating structure 20b on the first surface 1011b of the first semiconductor layer 101b and also covers the surrounding insulating part 201b formed on the first outside wall 1003b and the second outside wall 1001b which are composed by exposed side surfaces of the second semiconductor layer 102b, active layer 103b and the first semiconductor layer 101b, and the corners of the first surface 1011b of the first semiconductor layer 101b. Specifically, in the embodiment, the plurality of protrusions 5051b directly contacts the plurality of protrusion 2011b of the first insulating structure 20b, the plurality of recesses 5052b exposes the first surface 1011b of the first semiconductor layer 101b. The plurality of protrusions 5051b and the plurality of recesses 5052b are arranged alternately to discontinuously expose portions of the first surface 1011b of the first semiconductor layer 101b. That is to say, the portions of the first surface 1011b exposed by the plurality of recesses 5052b are discontinuous and have an total exposed area. The total exposed area of the exposed portions of first surface 1011b is smaller than an entire area of the first surface 1011b.

In the embodiment, a shape of one of the plurality of protrusions 5051b can include a triangle, a rectangle, a semicircle, a circle, and a polygon. A material of the second insulating structure 50b can be a non-conductive material. Herein the non-conductive material includes organic materials, inorganic materials or dielectric materials. The organic material includes Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium dioxide ($TiO_2$), or magnesium fluoride ($MgF_x$). The second insulating structure 50b includes a single layer or multiple sub-layers. The second insulating structure 50b protects the sidewall of the semiconductor structure 1000b to prevent the active layer 103b from being destroyed by the following processes. When the second insulating structure 50b includes multiple sub-layers, the second insulating structure 50b can be a distributed Bragg reflector (DBR) which includes a plurality pairs of layers, and each layer has a refractive index different from that of adjacent layers. In one embodiment, the second insulating structure 50b can be formed by alternately stacking a $SiO_x$ layer and a $TiO_x$ layer. The DBR can protect the sidewalls of the semiconductor structure 1000b and can provides a high reflectivity for particular wavelength or within a particular wavelength range by setting the refractive index difference between each pair of the layers with a high refractive index and a low refractive index respectively. The thicknesses of two layers in each pair can be different. The thicknesses of the layers in each pair with the same material can be the same or different.

Referring to FIGS. 1-4, the contact layer 60b is formed on the second insulating structure 50b and the reflective structure (the reflective layer 40b and the barrier layer 41b), and includes a first contact portion 600b, a second contact portion 601b, and a third contact portion 602b. In one embodiment, the second contact portion 601b is at a geometric center of the semiconductor structure 1000b in a top view of the light-emitting device 2. The first contact portion 600b and the third contact portion 602b are separated from one another. The third contact portion 602b is surrounded by the first contact portion 600b. Herein, the first contact portion 600b is electrically connected to the first semiconductor layer 101b, the third contact portion 602b is electrically connected to the second semiconductor layer 102b, and the second contact portion 601b is electrically isolated from the first semiconductor layer 101b and the second semiconductor layer 102b. In one embodiment, the second contact portion 601b is electrically connected to one of the first contact portion 600b and the third contact portion 602b. In one embodiment, the first contact portion 600b is electrically connected to the first semiconductor layer 101b by contacting the second surface 1012b and the first surface 1011b via the plurality of openings 501b and the plurality of recess 5052b of the second insulating structure 50b. Additionally, in a top view along the surrounding part 111b, the first contact portion 600b has a concave-convex top surface disposed along the periphery of the first insulating structure 20b or that of the second insulating structure 50b. The first contact portion 600b is formed on the plurality of protrusions 5051b and the plurality of recesses 5052b along the periphery 505b, and the concave-convex top surface is formed corresponding to the plurality of protrusions 5051b and the plurality of recesses 5052b. The first contact portion 600b contacts the first surface 1011b discontinuously via the plurality of recess 2012b of the surrounding insulating part 201b and the plurality of recesses 5052b of the second insulating structure 50b. There are a plurality of first contact regions (not shown) discontinuous between the first contact portion 600b and the first surface 1011b of the first semiconductor layer 101b. There is also a plurality of first contact regions (not shown) between the first contact portion 600b and the second surface 1012b of the first semiconductor layer 101b.

In the embodiment, the second contact portion 601b and the third contact portion 602b are surrounded by the first contact portion 600b. A shape of the second contact portion 601b in a top view includes a geometric shape, for example, a rectangle, a circle or irregular shape. The third contact portion 602b is electrically connected to the second semiconductor layer 102b via contacting the reflective structure through the opening 503b of the second insulating structure 50b. There is a second contact region (not shown) between the third contact portion 602b and the reflective structure. In one embodiment, the second contact portion 601b can connect with the first contact portion 600b or the third contact portion 602b. The contact layer 60b can be composed of a single layer or multiple sub-layers. The material of the contact layer 60b includes metal such as aluminum (Al), chromium (Cr), platinum (Pt), titanium (Ti), tungsten (W), or zinc (Zn).

Referring to FIGS. 1-4, after forming the contact layer 60b, a third insulating structure 70b is disposed on the contact layer 60b and covers the contact layer 60b. The third insulating structure 70b further includes a first opening 701b and the second opening 702b. The first opening 701b of the third insulating structure 70b exposes the first contact portion 600b of the contact layer 60b. The second opening 702b exposes the third contact portion 602b of the contact layer 60b. A material of the third insulating structure 70b includes non-conductive material which includes organic materials, inorganic materials or dielectric materials. The organic material includes Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_2$), titanium oxide ($TiO_2$), or magnesium fluoride ($MgF_2$). The first insulating structure 20b, the second insulating structure 50b, and the third insulating structure 70b can be formed by printing, evaporation or sputtering.

After forming the third insulating structure 70b, the first pad 80b and the second pad 90b are formed on the semiconductor stack 10b. Positions of the first pad 80b and the second pad 90b correspond to those of the first opening 701b and the second opening 702b of the third insulating structure 70b, respectively. In one embodiment, shapes of the first pad 80b and the second pad 90b can correspond to those of the first opening 701b and the second opening 702b of the third insulating structure 70b. The first pad 80b is electrically connected to the first semiconductor layer 101b by contacting the first contact portion 600b of the contact layer 60b through the first opening 701b of the third insulating structure 70b. The second pad 90b is electrically connected to the second semiconductor layer 102b by contacting the third contact portion 602b of the contact layer 60b through the second opening 702b of the third insulating structure 70b. In one embodiment, from the top view of the light-emitting device 2, the first pad 80b includes the same shape as that of the second pad 90b, for example, the first pad 80b and the second pad 90b include comb shape, but the invention is not limited hereto. In other embodiment, the shape or the size of the first pad 80b can be different from those of the second pad 90b. For example, the shape of the first pad 80b can be rectangular, and the shape of the second pad 90b can be comb-shaped, and the area of the first pad 80b can be larger than that of the second pad 90b. In one embodiment, the first pad 80b and the second pad 90b includes a structure having one or more layers. Materials of the first pad 80b and the second pad 90b include metal materials, such as chromium (Cr), titanium (Ti), tungsten (W), aluminum (Al), indium (In), tin (Sn), nickel (Ni), platinum (Pt), or an alloy of the above materials. When the first pad 80b and the second pad 90b include a multi-layer structure, the first pad 80b includes a first upper pad and a first lower pad, and the second pad 90b includes a second upper pad and a second lower pad. The upper pad and the lower pad have different functions. The function of the upper pad is used for soldering and wiring. The light-emitting device 2 can be flipped and mounted on a package substrate by using solder bonding or AuSn eutectic bonding through the upper pad. The metal material of the upper pad includes highly ductile materials such as nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os). The upper pad can be a single layer, a multilayer or an alloy of the above materials. In an embodiment of the present application, the material of the upper pad preferably includes nickel (Ni) and/or gold (Au) and the upper pad is a single layer or multilayer. The function of the lower pad is for forming a stable interface with the contact layer 60b, the reflective layer 40b or the barrier layer 41b, for example, improving the interface bonding strength between the first lower pad and the contact layer 60b, or enhancing the interface bonding strength between the second lower pad and the reflective layer 40b or the barrier layer 41b. Another function of the lower pad is to prevent tin (Sn) in the solder or AuSn from diffusing into the reflective structure, damaging the reflectivity of the reflective structure. Therefore, the lower pad preferably includes a metal material other than gold (Au) and copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os). The lower pad can be a single layer, an alloy, or a multilayer film of the above materials. In an embodiment of the present application, the lower pad preferably includes a multilayer film of titanium (Ti) and aluminum (Al), or a multilayer film of chromium (Cr) and aluminum (Al).

In one embodiment, while operating the light-emitting device 2, an outer power source is electrically connected with the first pad 80b and the second pad 90b, respectively. In that situation, a current is injected into the light-emitting device 2, spreaded by the first contact portion 600b and the third contact portion 602b and then injected into the first semiconductor layer 101b and the second semiconductor layer 102b via the first contact regions and the second contact region, respectively. In order to enhance the current distribution of the light-emitting device 2 and to avoid the current be crowded at some regions of the first surface 1011b, such as the corners of the first surface 1011b, an area and positions of the first contact regions between the first contact portion 600b and the first surface 1011b of the first semiconductor layer 101b can be adjusted. In one embodiment, since the surrounding insulating part 201b of the first insulating structure 20b and the periphery 505b of the second insulating structure 50b cover portions of the first surface 1011b of the first semiconductor layer 101b, the area and the positions of the first contact regions between the contact layer 60b and the first surface 1011b are adjusted by the surrounding insulating part 201b and the second insulating structure 50b. In other words, the area and the positions of the first contact regions are adjusted by the exposed portions of the first surface 1011b exposed by the recesses 2012b, 5052b of the surrounding insulating part 201b and the second insulating structure 50b. However, while designing the surrounding insulating part 201b of the first insulating structure 20b and the second insulating structure 50b, a tradeoff between forward voltage ($V_f$) and current distribution of the light-emitting device 2 has to be considered. In details, the bigger the area of the first contact regions is, and the lower forward voltage of the light-emitting device 2 achieves. However, if the area of the first contact regions is bigger, the current crowding effect might occur in the light-emitting device 2. In order to get an acceptable forward voltage ($V_f$) and a better current distribution, the first contact portion 600*b* is designed to discontinuously contact the first surface 1011*b* via the plurality of recesses 2012*b* and 5052*b*, be electrically isolated to portions of the first surface 1011*b* by the plurality of protrusions 2011*b* and 5051*b*. In one embodiment, the first contact portion 600*b* is designed to devoid of contacting the corners of the first surface 1011*b* of the first semiconductor layer 101*b* as mentioned above. In such manner, the current is injected to the first semiconductor layer 101*b* through the discontinuous first contact regions of the first contact portion 600*b* and is not able to directly be injected into the portions covered by the first insulating structure 20*b* and the second insulating structure 50*b*. Accordingly, the current can be spread by the first contact portion 600*b* and then further be spread by the discontinuous first contact regions. In other words, the design of surrounding insulating part 201*b* and the periphery 505*b* of the second insulating structure 50*b* can affect the forward voltage and change the current path to force the current flowing into regions of the first surface exposed by the plurality of recesses 2012*b* and the plurality of recess 5052*b* so to change the current distribution. In the embodiment, the area of the first contact region is large enough to get an acceptable forward voltage, for example, 2.15 V-2.4 V, and the desired current distribution can be achieved under the area of the first contact regions. The details are described as below.

Figure 5:
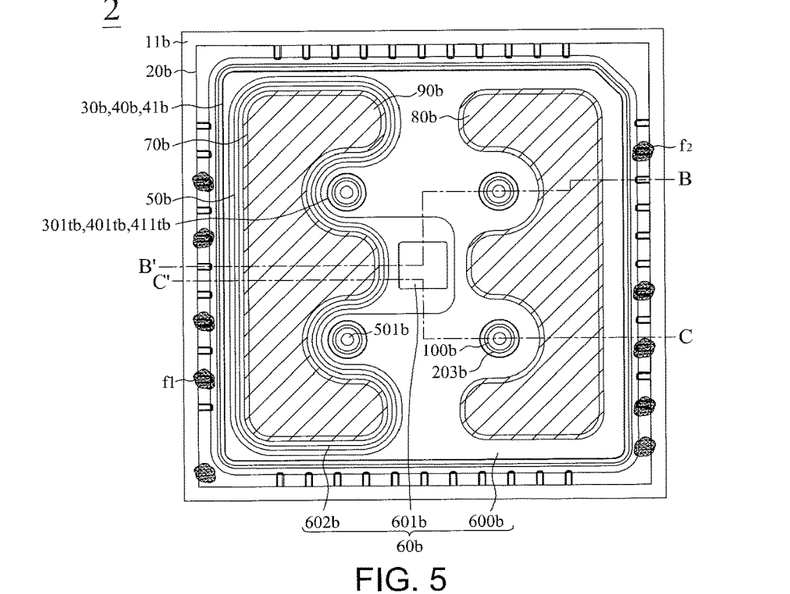
FIG. 5 illustrates a top view of broken-down regions of the light-emitting device 2 in accordance with an embodiment of the present application.
Figure 6:
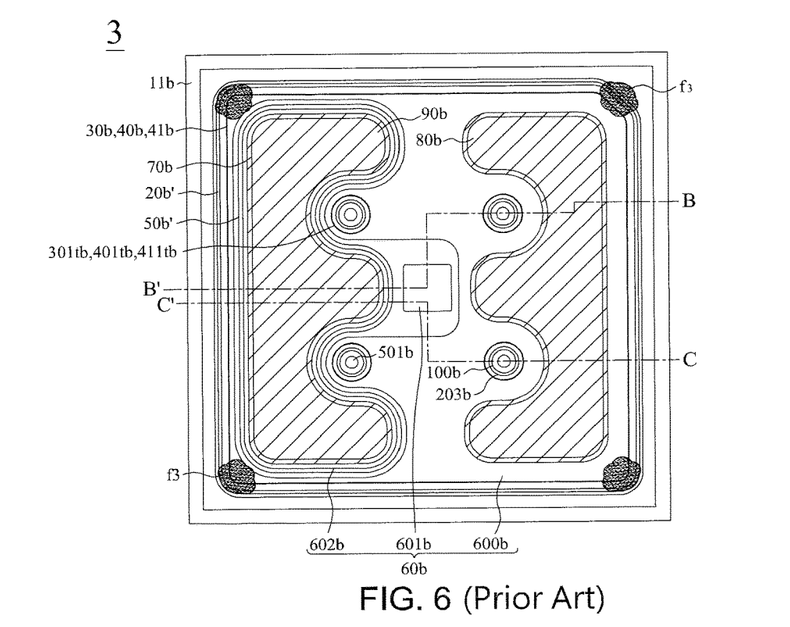
FIG. 6 illustrates a top view of broken-down regions of a conventional light-emitting device 3.

Please refer to FIG. 5 and FIG. 6. FIG. 5 shows a top view of broken-down regions of the light-emitting device 2. FIG. 6 shows a top view of broken-down regions of a conventional light-emitting device 3. The differences between the light-emitting device 2 and the conventional light-emitting device 3 are that a first insulating structure 20*b*' and a second insulating structure 50*b*' of the conventional light-emitting device 3 are devoid of the plurality of protrusions 2011*b*, 2051*b* and the plurality of recesses 2012*b*, 5052*b* of the light-emitting device 2. The entire first surface 1011*b* of the first semiconductor layer 101*b* is exposed for contacting with a contact layer 60*b* in the conventional light-emitting device 3, so that the contact layer 60*b* continuously contacts the first surface 1011*b* of the first semiconductor layer 101*b* and directly contacts corners (not shown) of the first surface 1011*b* of the first semiconductor layer in the conventional light-emitting device 3.

When a surge is injected into the conventional light-emitting device 3, the conventional light-emitting device 3 cannot take such a high voltage and distribute current effectively, so the conventional light-emitting device 3 is broken-down, especially at the corners due to the current crowding as shown in FIG. 6. Referring to FIG. 6, the voltage of the surge exceeds a normal operating voltage of the conventional light-emitting device 3, and such surge destroys the conventional light-emitting device 3 through several breakdown areas labelled as f3. These breakdown areas f3 are located at corners of the first surface of the first semiconductor layer. It is because the current injected into the conventional light-emitting device 3 prefers to crowd at the corners rather than other regions. Referring to FIG. 5, when a higher surge which is over the light-emitting device 2 can take is injected into it, the light-emitting device 2 is destroyed at several breakdown areas labelled as f2 as shown in FIG. 5. A distribution of the breakdown areas f2 is different from that of the areas f3 of the conventional light-emitting device 3, which means the current of the light-emitting device 2 is not crowed at corners of the first surface 1011*b* of the first semiconductor layer 101*b* and the current distribution of the light-emitting device 2 is more uniform than that of the conventional light-emitting device 3 to bear a higher surge.

Figure 7:
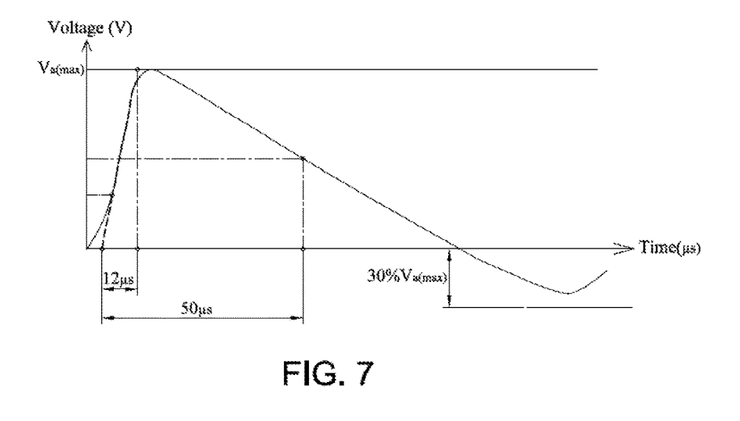
FIG. 7 illustrates a voltage waveform of a surge in EOS test.
Figure 8:
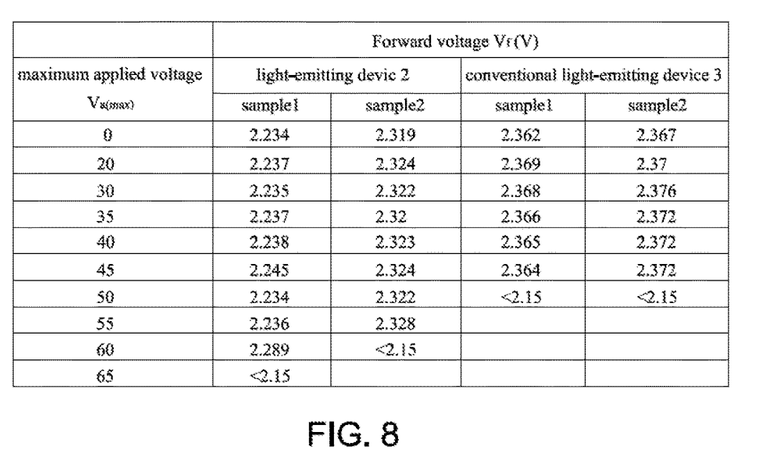
FIG. 8 illustrates a table of maximum applied voltages of the surge versus turned-on forward voltage ($V_f$) of the light-emitting device 2 and the conventional light-emitting device 3.
Figure 9:
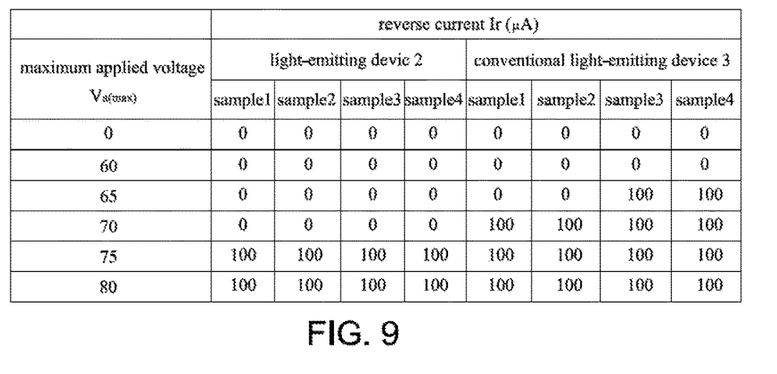
FIG. 9 illustrates a table of maximum applied voltages of the surge versus reverse current ($I_r$) of the light-emitting device 2 and the conventional light-emitting device 3.

In the embodiment, the discontinuous first contact regions between the contact layer 60*b* and the first surface 1011*b* of the first semiconductor layer 101*b* benefit current spreading and avoid breakdown in the light-emitting device 2. An acceptable forward voltage, for example, 2.15 V-2.4 V, and the desired current distribution of the light-emitting device 2 can be achieved by the discontinuous first contact regions. In one embodiment, the light-emitting device 2 and the conventional light-emitting device 3 are compared by EOS (electrical over stress) test under several applied voltages. Please refer to FIG. 7, FIG. 8, and FIG. 9. FIG. 7 shows a voltage waveform of a surge in EOS test. FIG. 8 is a table of maximum applied voltages of surges in the EOS test versus turned-on forward voltage ($V_f$) of the light-emitting device 2 and the conventional light-emitting device 3 after the EOS test. FIG. 9 is a table of maximum applied voltages of surges in the EOS test versus reverse current ($I_r$) of the light-emitting device 2 and the conventional light-emitting device 3 after the EOS test. In order to further compare the light-emitting device 2 of the present application and the conventional light-emitting device 3, as shown in FIG. 8, samples 1, 2 of the light-emitting device 2 and samples 1, 2 of the conventional light-emitting device 3 are selected for EOS test. During the EOS test (comply with the IEC 61000-4-5 standard), surges with the voltage waveform as shown in FIG. 7 are applied to the light-emitting device 2 and the conventional light-emitting device 3, respectively. Herein, voltages of each of the surges vary with time and each of the surges corresponds to a maximum applied voltage $V_{a(max)}$. In FIG. 8, the samples are tested by applying the surges with different maximum applied voltages $V_{a(max)}$, such as 0 V, 20 V, 30 V, 35 V, 40 V, 45 V, 50 V, 55 V, 60 V, and 65 V. For each maximum applied voltage $V_{a(max)}$, the surges are applied 5 times at a frequency of 1 time per second and a duration time of each of the surge is about $10^{-4}$ second. The size of each sample is about 38×38 mil$^2$. After being tested by the surges with these maximum applied voltages, the samples are driven under a constant current 10 μA, and the forward voltages ($V_f$) of each of the samples are measured and listed in the table of FIG. 8. In the table of FIG. 8, the forward voltages $V_f$ of sample 1 and sample 2 of the light-emitting device 2 are smaller than 2.15 V after EOS test under the surges with maximum applied voltages 65 V and 60 V, respectively. As to the conventional light-emitting device 3, the forward voltages $V_f$ of sample 1 and sample 2 of the conventional light-emitting device 3 are smaller than 2.15 V after EOS test under the surges with the maximum applied voltage 50 V. Additionally, since the acceptable forward voltage is between 2.15 V and 2.4 V, test results in sample 1 of the light-emitting device 2 after being applied the surges with a maximum applied voltage equal to or smaller than 60 V, shows the forward voltage is bigger than 2.15 V and smaller than 2.4 V, which means sample 1 of the light-emitting device 2 still works normally and passes the EOS test. Similarly, sample 2 of the light-emitting device 2, tested under the surges with a maximum applied voltage equal to or smaller than 55 V, still works normally and passes the EOS test. The performance of the light-emitting device 2 in the EOS test is better than the conventional light-emitting device 3. The light-emitting device 2 can bear 60 V of surges higher than the conventional light-emitting device 3.

In one embodiment, as shown in the FIG. 9, samples 1, 2, 3 and 4 of the light-emitting device 2 and samples 1, 2, 3 and 4 of the conventional light-emitting device 3 are selected for EOS test similar to above embodiment. Each of the samples is tested by applying the surges with different maximum applied voltages 0 V, 60 V, 65 V, 70 V, 75 V and 80 V. After being tested by the surges with these maximum applied voltages, the samples are driven under a reversed voltage −5 V, and the reverse current $I_r$ of each of the samples is measured and listed in the table of FIG. 9. In the embodiment, the acceptable reverse current $I_r$ of the light-emitting device is smaller than 0.3 μA. In the table of FIG. 9, when the light emitting device is damaged such as breakdown, the reverse currents $I_r$ (μA) will happen and be measured in 100 μA shown in FIG. 9 in the embodiment. The reverse currents $I_r$ (μA) of sample 1 to sample 4 of the light-emitting device 2 are 100 μA bigger than 0.3 μA after the EOS test under the surges with the maximum applied voltages 75 V and 80 V, which means the durable surge having the maximum applied voltages of the light-emitting device 2 is below 75 V. As to the conventional light-emitting device 3, the reverse currents $I_r$ (μA) of sample 1 to sample 4 of the conventional light-emitting device 3 are 100 μA bigger than 0.3 μA after the EOS test under the surges with the maximum applied voltages 65 V to 80 V, which means the durable surge having the maximum applied voltages of the light-emitting device 3 is below 65 V. Additionally, since the acceptable reverse current $I_r$ is smaller than 0.3 μA, the results in sample 1 to sample 4 of the light-emitting device 2 after being applied the surges with the maximum applied voltage equal to or smaller than 70 V, shows the reverse current $I_r$ is zero, which means sample 1 to sample 4 of the light-emitting device 2 still works normally and pass the EOS test. The performance of the light-emitting device 2 in the EOS test is better than the conventional light-emitting device 3 because the light-emitting device 2 can bear the maximum applied voltages in 70 V higher than that of the conventional light-emitting device 3.

According to FIG. 8 and FIG. 9, the reliability of the light-emitting device 2 under EOS test is better than that of the conventional light-emitting device 3. In the embodiments of present application, by the design of the surrounding insulating part 201b of the first insulating structure 20b and the periphery 505b of the second insulating structure 50b, the light-emitting device 2 of the application is able to avoid current crowding at corners. At the same time, the area and the positions of the first contact regions of the contact layer 60b also can be adjusted to get acceptable forward voltage. By doing so, an acceptable forward voltage, for example, 2.15 V-2.4 V, the desired current distribution of the light-emitting device 2 of the present application can be achieved, and the reliability can be improved accordingly.

Figure 10:
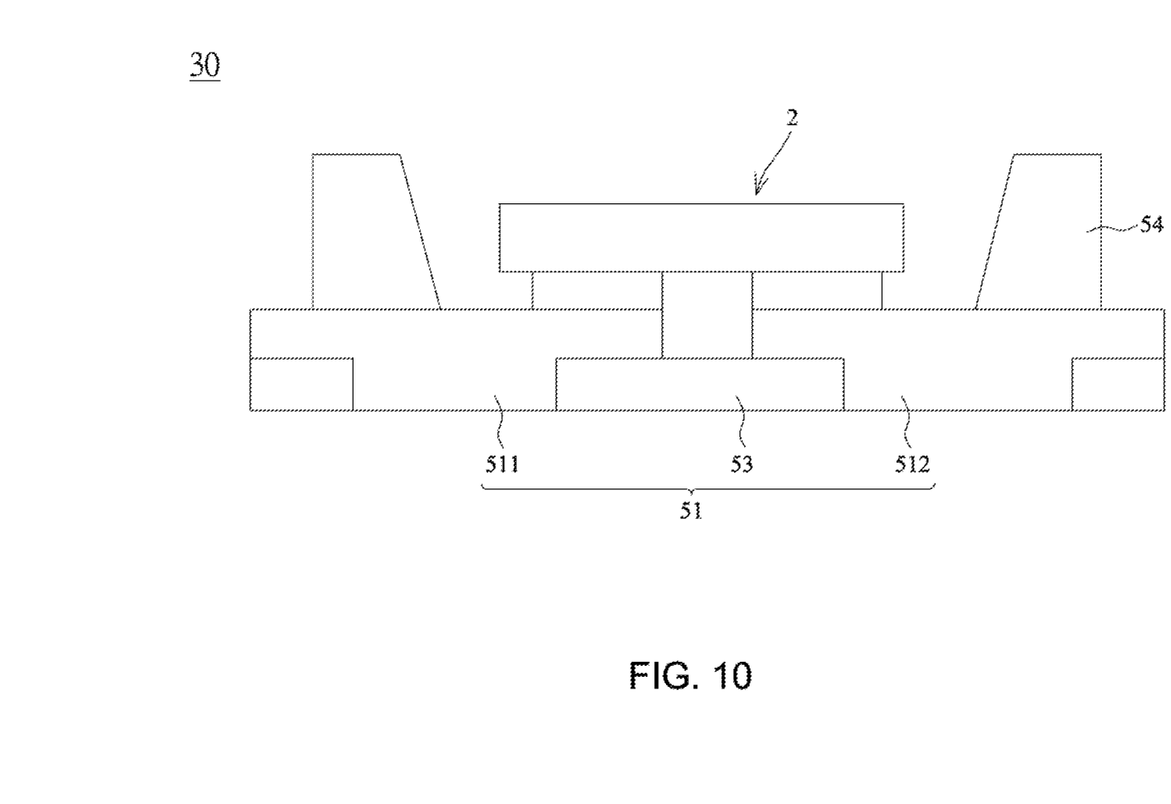
FIG. 10 illustrates a schematic view of a light-emitting apparatus in accordance with an embodiment of the present application.

FIG. 10 is a schematic view of a light-emitting apparatus 30 in accordance with an embodiment of the present application. The light-emitting device 2 in the foregoing embodiment is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip-chip is one side of the growth substrate 11b opposite to the electrode-forming surface. A reflective structure 54 can be provided around the light-emitting device 2 to increase the light extraction efficiency of the light-emitting apparatus 30.

Figure 11:
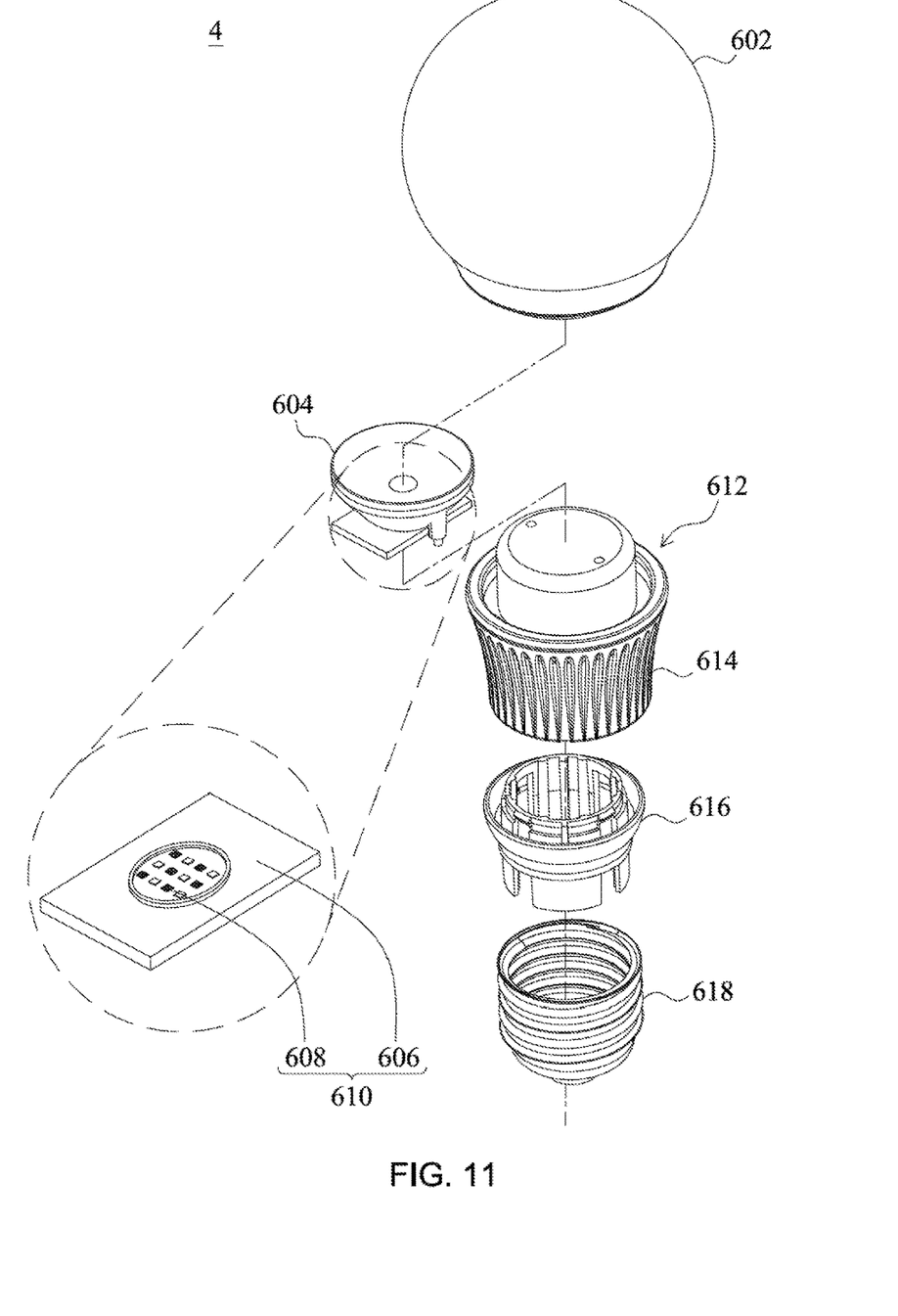
FIG. 11 illustrates a structure diagram of a light-emitting apparatus in accordance with an embodiment of the present application.

FIG. 11 illustrates a structure diagram of a light-emitting apparatus 4 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting devices or the light-emitting apparatus 30 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a semiconductor structure comprising a first semiconductor layer, a second semiconductor layer, and an active layer between the first semiconductor layer and the second semiconductor layer;
   a surrounding part surrounding the semiconductor structure and exposing a surface of the first semiconductor layer;
   a first insulating structure formed on the semiconductor structure, including a plurality of protrusions covering portions of the surface of the first semiconductor layer and a plurality of recesses exposing other portions of the surface of the first semiconductor layer;
   a first contact portion formed on the surrounding part and contacting the other portions of the surface of the first semiconductor layer by the plurality of recesses;
   a first pad formed on the semiconductor structure; and
   a second pad formed on the semiconductor structure.

2. The light-emitting device according to claim 1, further comprising a second contact portion formed at a geometric center of the semiconductor structure in a top view of the light-emitting device.

3. The light-emitting device according to claim 1, further comprising a third contact portion formed on the semiconductor structure, wherein the third contact portion is surrounded by the first contact portion.

4. The light-emitting device according to claim 1, further comprising a second contact portion formed at a geometric center of the semiconductor structure, wherein the second contact portion is connected to the first contact portion, and/or further comprising a third contact portion formed on the semiconductor structure, wherein the third contact portion is surrounded by the first contact portion and connected to the second contact portion.

5. The light-emitting device according to claim 1, further comprising one or a plurality of vias penetrating the second semiconductor layer and the active layer to expose the first semiconductor layer.

6. The light-emitting device according to claim 1, wherein the first insulating structure covers corners of the surface of the first semiconductor layer.

7. The light-emitting device according to claim 1, wherein the plurality of protrusions and the plurality of recesses are alternately arranged.

8. The light-emitting device according to claim 1, further comprising a second insulating structure formed on the surrounding part and covering the first insulating structure, wherein the second insulating structure comprises a shape corresponding to a shape of the first insulating structure.

9. The light-emitting device according to claim 1, further comprising a third insulating structure formed on the semiconductor structure, wherein the third insulating structure comprises a first opening and a second opening, and the first pad is formed in the first opening and the second pad is formed in the second opening.

10. The light-emitting device according to claim 1, wherein the first contact portion comprises a concave-convex top surface disposed along a periphery of the first insulating structure.

11. A light-emitting device, comprising:
a semiconductor structure comprising a first semiconductor layer, a second semiconductor layer, and an active layer between the first semiconductor layer and the second semiconductor layer;
a surrounding part surrounding the semiconductor structure and exposing a surface of the first semiconductor layer;
a first insulating structure formed on the semiconductor structure, covering corners of the surface of the first semiconductor layer and exposing portions at edges of the surface of the first semiconductor layer;
a first contact portion formed on the surrounding part and contacting the portions at edges of the surface of the first semiconductor layer;
a first pad formed on the semiconductor structure; and
a second pad formed on the semiconductor structure.

12. The light-emitting device according to claim 11, further comprising a second contact portion formed at a geometric center of the semiconductor structure in a top view of the light-emitting device.

13. The light-emitting device according to claim 11, further comprising a third contact portion formed on the semiconductor structure, wherein the third contact portion is surrounded by the first contact portion.

14. The light-emitting device according to claim 11, further comprising a second contact portion formed at a geometric center of the semiconductor structure, wherein the second contact portion is connected to the first contact portion.

15. The light-emitting device according to claim 11, further comprising one or a plurality of vias penetrating the second semiconductor layer and the active layer to expose the first semiconductor layer.

16. The light-emitting device according to claim 11, wherein the first insulating structure comprises a plurality of protrusions covering the surface of the first semiconductor layer and a plurality of recesses exposing the surface of the first semiconductor layer.

17. The light-emitting device according to claim 16, wherein the plurality of protrusions and the plurality of recesses are alternately arranged.

18. The light-emitting device according to claim 16, further comprising a second insulating structure formed on the surrounding part and covering the first insulating structure, wherein the second insulating structure comprises a shape corresponding to a shape of the first insulating structure.

19. The light-emitting device according to claim 11, further comprising a third insulating structure formed on the semiconductor structure, wherein the third insulating structure comprises a first opening and a second opening, and the first pad is formed in the first opening and the second pad is formed in the second opening.

20. The light-emitting device according to claim 11, wherein the first contact portion comprises a concave-convex top surface disposed along a periphery of the first insulating structure.

* * * * *